United States Patent [19]
Xu et al.

[11] Patent Number: 5,855,956
[45] Date of Patent: Jan. 5, 1999

[54] METHOD FOR AUTOSTOICHIOMETRIC CHEMICAL VAPOR DEPOSITION

[75] Inventors: Ren Xu; Kueir-Weei Chour, both of Salt Lake City, Utah

[73] Assignee: University of Utah, Research Foundation, Salt Lake City, Utah

[21] Appl. No.: 344,509

[22] Filed: Nov. 23, 1994

[51] Int. Cl.$^6$ .................................................. C23C 16/00
[52] U.S. Cl. ................................... 427/255.2; 427/255.1; 427/248.1
[58] Field of Search ............................ 427/255.2, 255.3, 427/255.1, 126.3, 248.1

[56] References Cited

U.S. PATENT DOCUMENTS

| | | | |
|---|---|---|---|
| H1170 | 4/1993 | Purdy | 556/113 |
| 4,888,203 | 12/1989 | Rothschild et al. | 427/126.3 |
| 5,213,844 | 5/1993 | Purdy | 427/248.1 |

OTHER PUBLICATIONS

Sladek et al, "Low Temperature metal oxide deposition by alkoxide hydrolysis", Proceedings of the International Conference on Chemical Vapor Deposition (3rd), Salt Lake City, Utah, 24–27 Apr. 1972, pp. 215–231.

*Primary Examiner*—Roy V. King
*Attorney, Agent, or Firm*—Trask, Britt & Rossa

[57] ABSTRACT

The chemical vapor deposition of a single phase of a double metal oxide having a stoichiometric ratio results in a fully dense film. The film is deposited by polycondensation of a partially hydrolyzed precursor reacted from water vapor mixed with a volatile, metalorganic precursor having the desired stoichiometric ratio. The film may be annealed to form a perfect crystal of stoichiometric, single phase, double metal oxide having substantially improved optical characteristics for laser light transmission and other electro-optical applications.

1 Claim, 7 Drawing Sheets

METHOD FOR AUTOSTOICHIOMETRIC CHEMICAL VAPOR DEPOSITION

BACKGROUND OF THE INVENTION

1. Field of the Invention

This invention pertains to chemical vapor deposition. It is particularly directed to methods and apparatus for chemical vapor deposition of a metal oxide film on a substrate.

2. Background

For convenience, terms derived from or related to the word "stoichiometry" are used in this disclosure variously as nouns, adjectives or other parts of speech. While this usage may not in every instance be grammatically precise, it is in harmony with common practice in the relevant art. All such terms should be understood in context to refer to compositions or materials, such as precursors, films or crystals, in which the constituent elements or moieties are present in an essentially stoichiometric ratio. For example, a thin film of essentially perfect crystalline composition may be referred to as having the correct "stoichiometry" or as being "stoichiometric."

Vapor deposition involves the evaporation or sublimation of a precursor material, and the subsequent condensation of selected constituents of the precursor onto a substrate. The formation of metallic or metal oxide films through physical vapor deposition techniques typically requires very high temperatures, on the order of 1200°–2000° C., to evaporate the coating material. Low pressures, generally less than 1 mm Hg, are also required. Chemical vapor deposition techniques may be conducted at lower temperatures and higher pressures, but tend to produce non-stoichiometric films. Chemical vapor deposition involves the destructive vaporization of a metalorganic precursor material, typically by pyrolysis.

Precursors which include multiple metal constituent materials tend to decompose when pyrolyzed, thereby producing a film containing non-stoichiometric ratios of the metals. For films to be useful for optical applications, they should be characterized by an essentially perfect crystal lattice structure. Flawed double metal oxide films form imperfect crystals which render them substantially useless for optical transmission in electro-optical devices.

Impurities, voids or non-stoichiometric structure in a crystal will create color centers and other optical inhomogeneities that alter the light or scatter it, destroying the effectiveness of the transmitted light beam. Any such imperfection will typically degrade the coherency or intensity of a transmitted beam.

According to the conventional sol gel process, a precursor, such as a metalorganic compound, is coated onto a substrate, for example, by dipping. The coating must then be heated to drive off the undesired organic constituents, leaving the desired film, typically a double metal oxide. The sol gel process leaves many and large voids that must be reduced by sintering. Sintering causes substantial reductions in film thickness, thereby producing a film of uneven thickness in which voids typically remain. Impurities and non-stoichiometric species, while fewer than typically result from pyrolytic deposition techniques, are nevertheless characteristically present.

Metal oxide chemical vapor deposition (MOCVD) of multicomponent oxide films has involved the use of separate metalorganic compounds containing the respective film components as precursors. The precursor compounds are ordinarily independently transformed to the vapor phase (by evaporation or other means) in a controlled manner to achieve the desired molar ratio between vapor phase species. Whether a given vapor phase composition results in the desired film composition may be determined as a practical matter only after a compositional analysis of the final film is performed. While this approach allows for convenient variation of compositions away from stoichiometric ratios, it inevitably requires a trial-and-error approach to achieve a precisely stoichiometric film composition.

U.S. Pat. No. 5,213,844 discloses volatile alkoxide precursors for chemical vapor deposition on substrates to produce films having superconductivity properties. U.S. Pat. No. 5,185,317 discloses the use of vaporized metal precursors in chemical vapor deposition procedures to achieve molecular level uniformity of coatings. U.S. Pat. Nos. 5,173,455; 5,139,976 and 4,835,298 disclose double alkoxides and their hydrolysis in the liquid state. U.S. Pat. No. 5,160,618 discloses chemical vapor deposition procedures for the growth of crystals of multi-component metal oxides on substrates. U.S. Pat. No. 5,112,676 discloses the use of precursor material containing metals in the same proportions as desired for a microwave oven metal oxide coating. U.S. Pat. No. 5,076,901 discloses metalorganic chemical vapor deposition of volatile metal precursors. U.S. Pat. No. 4,898,842 discloses the use of metalorganic precursors for forming metal oxide layers in electronic components. This patent also discusses known procedures for hydrolyzing double alkoxide precursors to homogeneous perovskites and spinels. U.S. Pat. No. 4,543,341 discloses the hydrolysis of double alkoxides in the formation of metal oxides. The disclosures of each of these patents are incorporated as a part of this disclosure for their teachings concerning the conventional operations incidentally involved in connection with the practice of this invention.

There has not heretofore been available any procedure for the practical application of vapor deposition techniques to metallo-organic precursors capable of crystal growth at low temperatures. It has not been known how to apply vapor deposition technology, notably vapor phase hydrolysis, to double alkoxide precursors to produce a homogeneous phase from which may be grown large crystals containing the same stoichiometric ratio of metals as exists in the precursor.

There remains a need for an improved vapor deposition technique capable of producing nearly stoichiometric metal oxide films suitable for use in optical applications. Such a technique would be expected to be useful in the production of other films useful for other applications.

SUMMARY OF THE INVENTION

This invention provides a chemical vapor deposition method whereby a film is produced from a single species. According to a preferred embodiment, a single metalorganic precursor having a correct stoichiometric ratio of metals is utilized to produce a dense double metal oxide film of much better quality than has heretofore been available. A volatile, metalorganic precursor having the desired stoichiometric ratio of metals is partially hydrolyzed by reacting it with a hydrolyzing agent, such as water vapor. This partially hydrolyzed precursor is deposited as a film on a substrate by polycondensation. The film may be annealed to form an essentially perfect crystal of stoichiometric double metal oxide composition. Such films have excellent optical characteristics for laser light transmission and other electro-optical applications.

In theory, this invention takes advantage of the inherent characteristics of the hydrolysis-polycondensation reaction scheme. The hydrolysis reaction is essentially an SN2 reaction. The bridging alkoxy group which links a first metal M' to a second metal M" is not readily accessible to $H_2O$ molecules due to steric hindrance, thereby preserving the integrity of this linkage throughout the deposition process. That is, the metals are each present in a double bond association, rendering other bonds preferential for a hydrolysis reaction with water. In a general form, the hydrolysis-polycondensation reaction can be expressed by the following reaction equations:

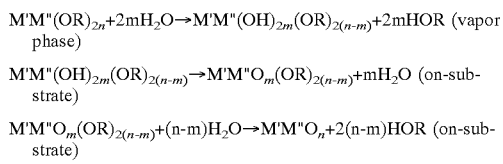

Preferred embodiments of the invention rely upon a single metalorganic compound, carrying all metal elements in the appropriate ratio, as the precursor. Ideal such precursors should exist in stable form, be sufficiently volatile for practical evaporation, and be capable of maintaining their initial metal-to-metal ratio throughout the deposition process.

Double metal alkoxides are possible candidates for such molecular precursors. It has been established that a large group of such compounds exist in molecular form stable enough to be easily isolated through low pressure sublimation.

The precursors contemplated include all those that can be hydrolyzed and polycondensed. Table 1 lists a number of volatile double alkoxides presently deemed useful as precursors for the stoichiometric vapor deposition of ferroelectric oxide films.

TABLE 1

Volatile double alkoxides and their potential used as precursors for stoichiometric vapor deposition of ferroelectric oxides.

| Double Alkoxide | Vapor Pressure (°C./Torr) | Ceramic/Application |
|---|---|---|
| LiTa(OEt)$_6$ | 230/0.2 | LiTaO3/pyroelectricity |
| LiTa(OPr$^i$)$_6$ | 160–80/0.1 | |
| LiTa(OBu$^t$)$_6$ | 110–20/0.1 | |
| LiNb(OPr$^i$)$_6$ | <140/0.2 | LiNbO$_3$/electro-optics |
| LiNb(OBu$^t$)$_6$ | 110–20/0.1 | |
| KNb(OPr$^i$)$_6$ | <200/0.8 | KNbO$_3$/electro-optics |
| KNb(OBu$^t$)$_6$ | <200/0.8 | non-linear optics |
| KNb(OBu$^t$)$_6$ | <200/0.8 | KTN (KTa$_{1-x}$Nb$_x$O$_3$) |
| KTa(OBu$^t$)$_6$ | <200/0.8 | electro-optic, second harmonic generation, storage |
| Sr[Nb(OPr$^i$)$_6$]$_2$ | 210–20/0.1 | SBN (Sr$_x$Ba$_{1-x}$NB$_2$O$_6$) |
| Ba[Nb(OPr$^i$)$_6$]$_2$ | 170–80/0.1 | Pyroelectric, electro-optic |

The double alkoxide precursors of Table 1 are chosen for their specific applications, and if properly processed, would be expected to result in the metal oxide ceramics listed when used in the chemical vapor deposition of hydrolyzed precursors as described. The ferroelectric oxides listed have metal constituent stoichiometry identical to the corresponding double alkoxides listed. These double alkoxides possess the desired metal-to-metal ratio in their molecular form, and are volatile enough for at least low pressure vapor deposition. They may not, however, possess sufficient thermal stability for practical deposition at elevated temperatures. Specifically, a double alkoxide M'M"(OR)$_{2n}$ may decompose prematurely to produce individual metal alkoxides:

$$M'M''(OR)_{2n} \rightarrow M'OR + M''(OR)_{2n-1}$$

Since M'OR and M"(OR)$_{2n-1}$ usually have different volatilities, premature thermal decomposition may result in non-stoichiometric deposition. For all known double alkoxides, decomposition occurs at temperatures much lower than the pyrolytic temperatures of M'OR or M"(OR)$_{2n-1}$. Thus, pyrolysis reactions are impractical for producing useful films from these precursors; the M' to M" ratio is lost prior to film deposition.

A method for the chemical vapor deposition of a heterometaloxide film in accordance with this invention involves generally selecting a volatile precursor which contains metal constituents in the stoichiometric ratio desired for the film; vaporizing the precursor at a selected rate; hydrolyzing a portion of the precursor in the vapor state to form a hydrolyzed precursor and reacting the hydrolyzed precursor on a substrate to form the film. The film contains the metal constituents in essentially the same stoichiometric ratio as the precursor.

A specific procedure involves positioning a substrate on a holder, vaporizing a precursor comprising a stoichiometric double metal alkoxide into a precursor vapor, hydrolyzing at least a portion of the precursor vapor with water vapor to form a hydrolyzed precursor, polycondensing the hydrolyzed precursor on a substrate to deposit a film comprised of a stoichiometric double metal oxide and to condense water and annealing the film to form a substantially perfect crystal.

The method more specifically involves placing a substrate within a chamber of an apparatus—(the apparatus comprises a chamber for containing the substrate, an evaporator constructed and arranged to vaporize a precursor and to introduce such a vaporized precursor into the chamber, a generator positioned to introduce a hydrolyzing agent into the chamber, a reaction zone within the chamber positioned to receive the precursor and the hydrolyzing agent, whereby to hydrolyze the precursor and structure positioned within the chamber in the proximity of the reaction zone, the structure being constructed and arranged to promote a polycondensation reaction of the hydrolyzed precursor on the substrate)—introducing a volatile multimetalorganic precursor to the evaporator and operating the evaporator to effect delivery of the vaporized precursor to the reaction zone, operating the generator to effect the delivery of a hydrolyzing agent to the reaction zone and establishing conditions of temperature and pressure in the vicinity of the substrate to promote the hydrolysis and polycondensation reactions, whereby to effect the deposition of a film containing each of the metal constituents of the multimetal organic precursor in the stoichiometric ratio that those constituents are present in the precursor. The method may further include the step of mounting the substrate on a holder constituting means for altering the temperature of the substrate. The holder is typically operated to control temperature of the substrate to within the range of about 400° to about 800° C. The substrate may be transferred, following the polycondensation reaction, to an annealing structure and the annealing structure may be operated to produce a film of increased crystallinity. The annealing structure is desirably operated in accordance with known procedures to promote the growth of the film into a substantially perfect crystal. The film may be annealed to form a perfect crystal of stoichiometric, single phase, double metal oxide having substantially improved optical characteristics for laser light transmission and other electro-optical applications.

A typical method of this invention is conducted in a low-pressure chamber. For example, a precursor may be vaporized in an evaporator and mixed with water vapor. Metal alkoxides, particularly double-metal alkoxides, are presently preferred precursors. The correct stoichiometry of a film deposited by chemical vapor deposition techniques is inherently controlled by selecting a precursor having that stoichiometric ratio of the film constituent metals.

One method of this invention introduces two streams of carrier gas into a chamber through respective gas inlets. The first carrier gas, typically air, entrains water vapor. The second carrier gas is typically selected from the group consisting of argon, helium, neon, radon, nitrogen, and oxygen. The flow of this stream through the second inlet supplies a mixture of the precursor vapor and carrier gas into the chamber.

The chamber is sealed and evacuated by a vacuum pump, and provided with a holder for positioning a substrate in the chamber. Various controlled inlets may be provided to introduce gaseous or vaporous materials into the chamber at controlled rates. The vacuum pump may remain connected and operating to maintain a low pressure, on the order of a few millimeters of mercury or less, in the chamber.

The water and precursor vapors react to form a hydrolyzed precursor. This process may occur in a separate chamber (plenum) or in a portion of a line conducting the gases and vapors. Under proper mixing conditions, hydrolysis may occur near the substrate, just prior to polycondensation of the hydrolyzed precursor on the substrate. Typically, only a portion of the precursor need be hydrolyzed in practice prior to deposition. Hydrolysis normally continues on the substrate surface during deposition.

The films produced through hydrolysis and polycondensation may comprise metal oxide, preferably a double metal oxide. The film may be amorphous or it may be annealed to promote growth of a continuous crystal. It is particularly advantageous for the double metal oxide to be stoichiometric, because stoichiometric films are more readily crystallized to perfect, stoichiometric crystals.

The films of this invention may comprise an essentially continuous metal oxide crystal having optical transmission properties. The crystal may have ferroelectric properties; shifting the phase of transmitted coherent light by application of an electrical field. High optical transmissivity and related properties benefit from a very nearly perfect crystal structure within the metal oxide lattice. Annealing by heating may contribute significantly to the formation of a virtually perfect crystal.

A structure for annealing the film may be inside, or otherwise associated with, the vapor deposition chamber, or it may be at a remote location. The annealing structure adds heat to elevate the temperature of the film. Annealing may be done at a time close to that of the deposition or at a later time. The structure for annealing may facilitate or cause growing of the deposited film into a substantially perfect crystal.

It is recognized that a perfect crystal has no impurities, voids, or non-stoichiometric structure in it. An "essentially" perfect crystal is so nearly perfect as to be optically clear enough to pass light, such as laser signals, without "excessive" scattering or diminution of coherence or intensity, of a high energy laser beam. The meaning of "excessive" depends upon the application, but generally indicates that the operability of the crystal is not satisfactory or reliable within the practical requirements of the application.

BRIEF DESCRIPTION OF THE DRAWINGS

In the drawings, which illustrate what is currently regarded as the best mode for carrying out the invention.

DETAILED DESCRIPTION OF THE ILLUSTRATED EMBODIMENTS

Figure 1:
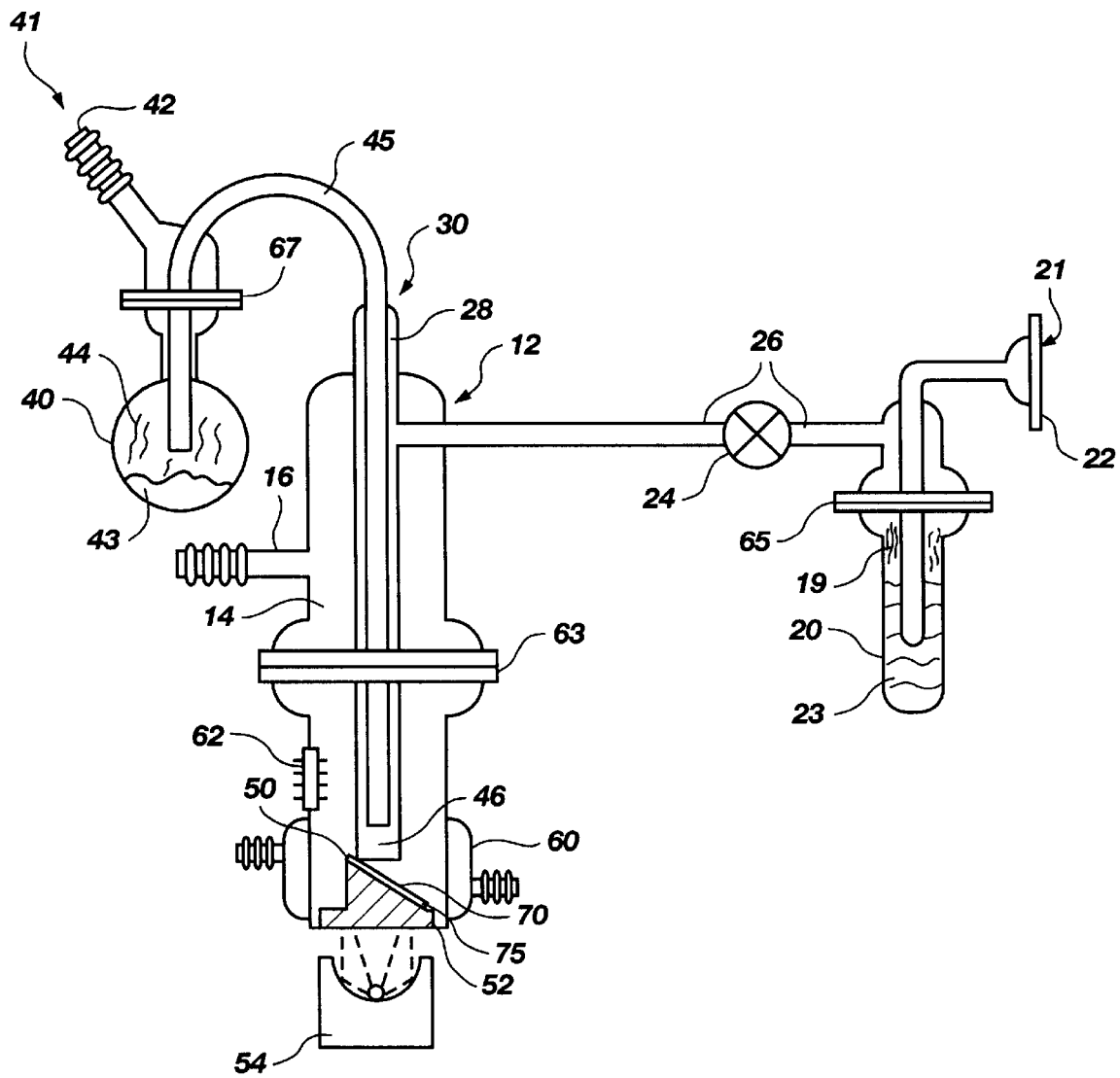
FIG. 1 is a schematic diagram of an apparatus useful for the practice of this invention.

As illustrated by FIG. 1, the main components of an apparatus suitable for the deposition of stoichiometric films include a reactor, designated generally 12, with an interior 14 communicating through a conduit 16 to a vacuum pump (not shown). Entrained water vapor 19 is produced in a generator 20. A carrier gas 21 is introduced through the inlet 22, and bubbles through a water pool 23 to produce the mixture 19, which is then fed through a capillary valve 24 and a conduit 26 to the annulus 28 of a hydrolysis tube array, generally 30.

A suitable precursor is volatilized in the evaporator 40, and is mixed with a carrier gas 41 introduced through the inlet 42. Generally, a precursor 43 having the stoichiometric ratio of metals desired for the film it is intended to deposit is introduced to the evaporator 40. The precursor 43, typically a metalorganic compound, is normally a solid at ambient temperature. Heat may be applied by any convenient expedient to cause the precursor 43 to sublime, creating vapors 44, which are then carried in admixture with the gas 41 through the conduit 45. The rate of flow of the precursor vapors 44 may be governed in part by controlling the rate at which heat is applied to the evaporator 40, thereby adjusting the vapor pressure of the precursor 43. The mixture of gas 41 and vapor 44 is conducted through the interior tube 45 of the array 30 to mix with the entrained hydrolyzing agent (water vapor) 19 in the region 46. The precursor is partially hydrolyzed in the region 46 as gas/vapor (19, 41, 44) mixture is directed towards a substrate material 50 mounted upon a graphite susceptor 52.

The susceptor 52 is heated by an infra red lamp assembly 54. Polycondensation occurs as the gas/vapor mixture impinges upon the substrate 50. Cooling water may be circulated as appropriate through the cooling jacket 60. A thermocouple feedthrough 62 is provided to permit monitoring of critical temperatures. The thermocouple data may be connected to drive control circuitry (not shown) to regulate gas flow rates, cooling water flow rate, heating duty cycle and other process parameters.

The reactor 12 may be opened at the flange 63 to mount the substrate 50 as shown. Similarly, the generator 20 may be opened at the flange 65, and the evaporator 40 may be opened at the flange 67.

The apparatus illustrated by FIG. 1 is illustrative only. In practice, many structural modifications and additions will inevitably be deemed advisable by those knowledgeable in the art of vapor deposition. For example, there are many known devices and methodologies for generating water vapor, any of which could be useful under certain conditions. Similarly, various expedients might be selected to evaporate specific precursor materials. Particular applications will require specific modifications, but the invention can be understood in a general way by reference to FIG. 1.

Figure 2:
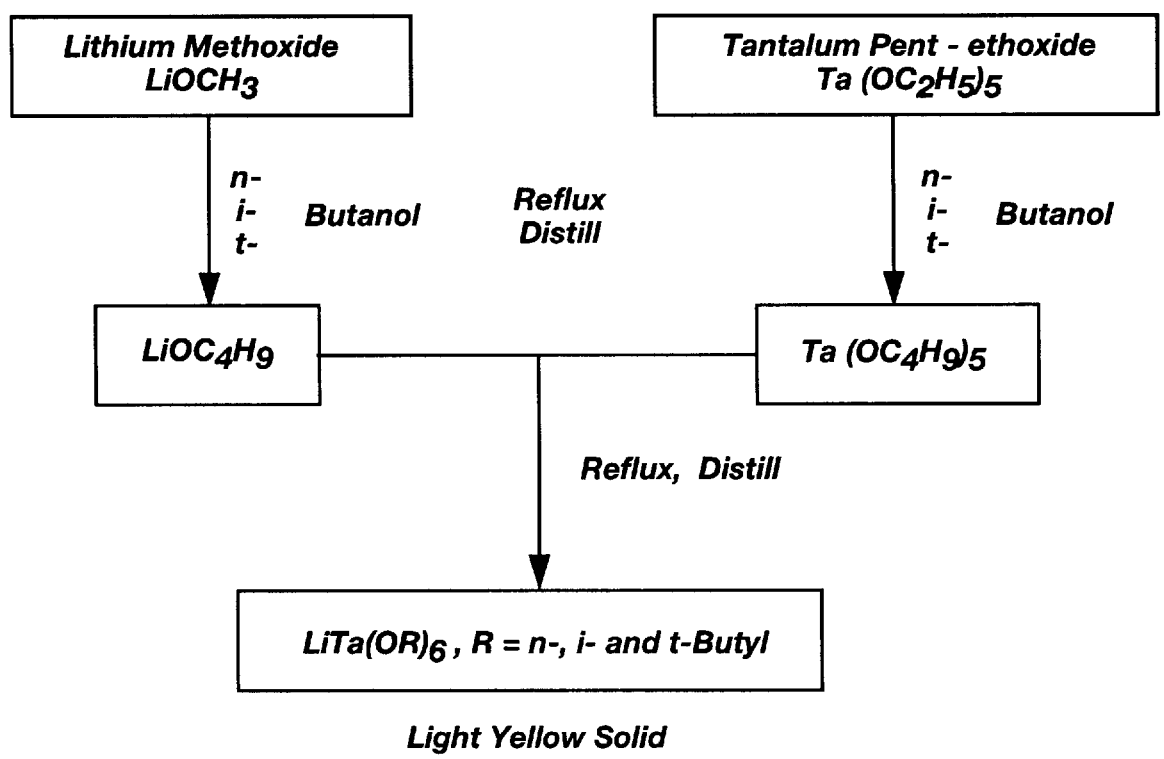
FIG. 2 is a flow chart illustrating a typical process for manufacturing a stoichiometric precursor useful for the practice of this invention.

FIG. 2 illustrates a generalized process for manufacturing Lithium-Tantalum alkoxy [LiTa(OR)$_6$, wherein R=any of the n-, i-, or t- isomers of a selected alcohol, e.g. i-butyl] precursors useful for this invention.

EXAMPLES

Ferroelectric LiTaO$_3$ has useful high electro-optic and piezoelectric coefficients for integrated optic applications. For IR detectors, it has a relatively high Curie point and fast response time. LiTaO$_3$ may be useful for second harmonic generations. However, high power lasers may cause optical damage in the wave guide material if defects exist due to off-stoichiometry LiTaO$_3$. Nevertheless, because LiTaO$_3$ has an off-stoichiometry congruent melting point at 48.75 mol % of Li$_2$O, most commercial LiTaO$_3$ single crystals are supplied at the off-stoichiometry composition.

The precursors tested include LiTa(OR)$_6$, in which R was selected for various runs from each of the n-butyl, i-butyl, and t-butyl groups. Precursors were prepared according to the flow chart in FIG. 2 from 99.9% Ta(OC$_2$H$_5$)$_5$ available from Johnson Matthey Co. of Ward Hill, Mass., 98% LiOCH$_3$ available from Aldrich Chemical Co. of Milwaukee, Wis., and 99.9% normal-, iso- and tert-butanols available from J. T. Baker Co. of Phillipsburg, N.J.

An apparatus substantially as illustrated by FIG. 1 was operated to produce films in accordance with the following specific Examples.

Example I

The interior 14 of the reactor 12 was evacuated to about 10$^{-2}$ torr through a liquid nitrogen trap by a mechanical vacuum pump connected to the conduit 16. The precursors were placed as shown at 43 in the evaporator 40, and were heated to generate vapors 44.

Nitrogen gas was introduced at the inlet 42 to carry the evaporated precursor vapor 44 of LiTa(OR)$_6$ to the reaction region 46 and the deposition region 70, adjacent a substrate 50. Air 21 was bubbled through water 23, and the resulting air/water mixture 19 was mixed with the precursor vapor-N$_2$ admixture in the reaction region 46. Partial hydrolysis-polycondensation occurred in the vapor phase in close proximity of the surface of the heated substrate 50.

Homogeneous deposition of an amorphous LiTaO$_3$ film 75 occurred on the substrate 50 through hydrolysis-polycondensation reactions. The deposited films 75 were amorphous regardless of the deposition temperature in experiments covering the range of 450° C. to 750° C. at the substrate 50. The films 75 became crystalline after annealing at temperatures between about 50°–100° C. higher than that used for film depositions. X-ray diffraction and electron microscopy were used to characterize the films thus deposited. The ranges of conditions of the experiments conducted are summarized in Table 2.

TABLE 2

| | |
|---|---|
| Initial Pressure | 0.1–0.4 mbar |
| Substrate Temperature | 450–750° C. |
| Peecursor Temperature | 195 ± 5° C. |
| Precursor Vapor Pressure (including carrier gas) | 3.1–3.3 mbar |
| Water Vapor Pressure (including carrier gas) | 1.3–2.7 mbar |

Figure 3:
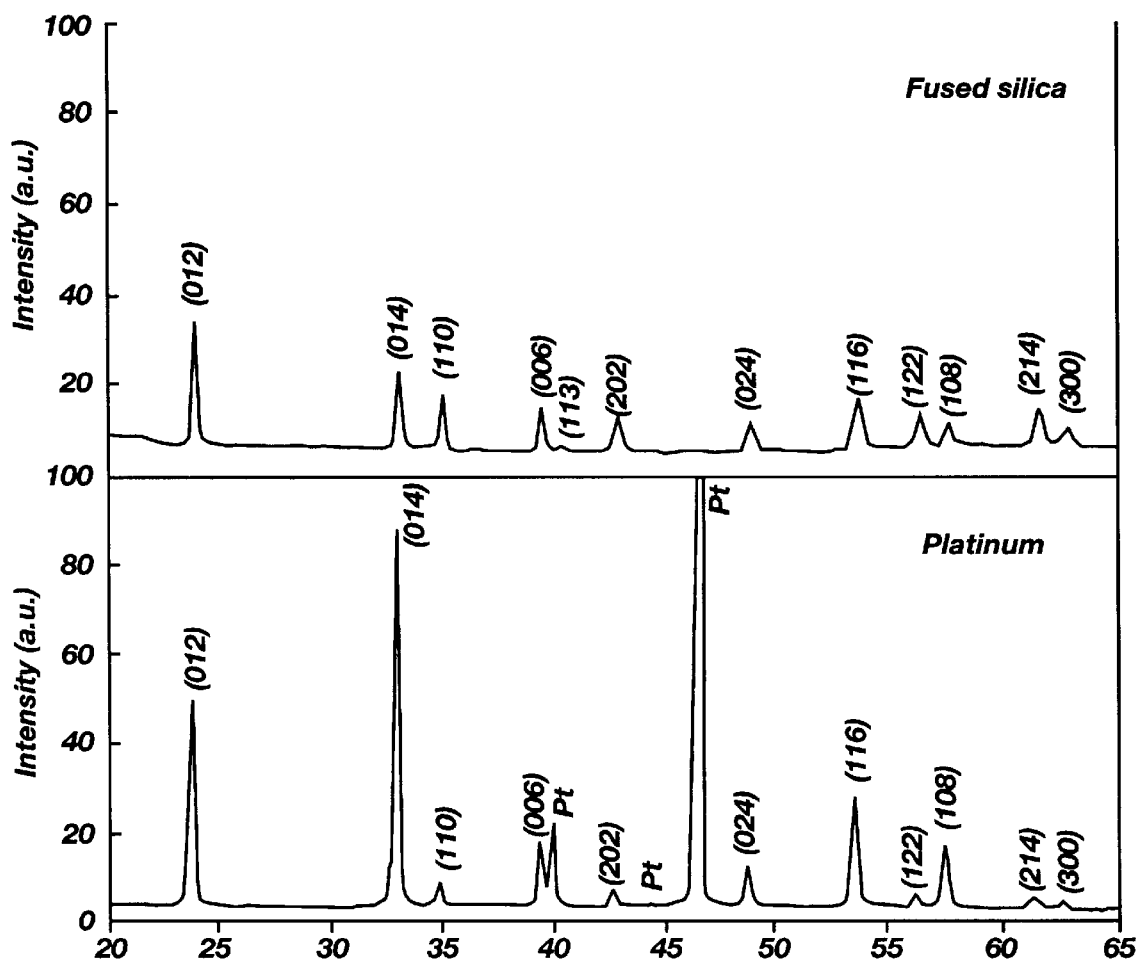
FIG. 3 illustrates the characteristic X-ray diffraction patterns of $LiTaO_3$ films produced in accordance with this invention on substrates of fused silica and platinum, respectively.

FIG. 3 illustrates the X-ray diffraction patterns of films 75 of LiTaO$_3$ deposited on fused silica (top) and platinum (bottom) substrates 50. Films 75 were typically polycrystalline. The X-ray diffraction patterns specifically illustrated by FIG. 3 are of films deposited at 500° C. and annealed at 600° C. for 5 hours. The X-ray diffraction patterns of FIG. 3 reveal no observable second phases, indicating that the films 75 are essentially single phase LiTaO$_3$.

Figure 4:
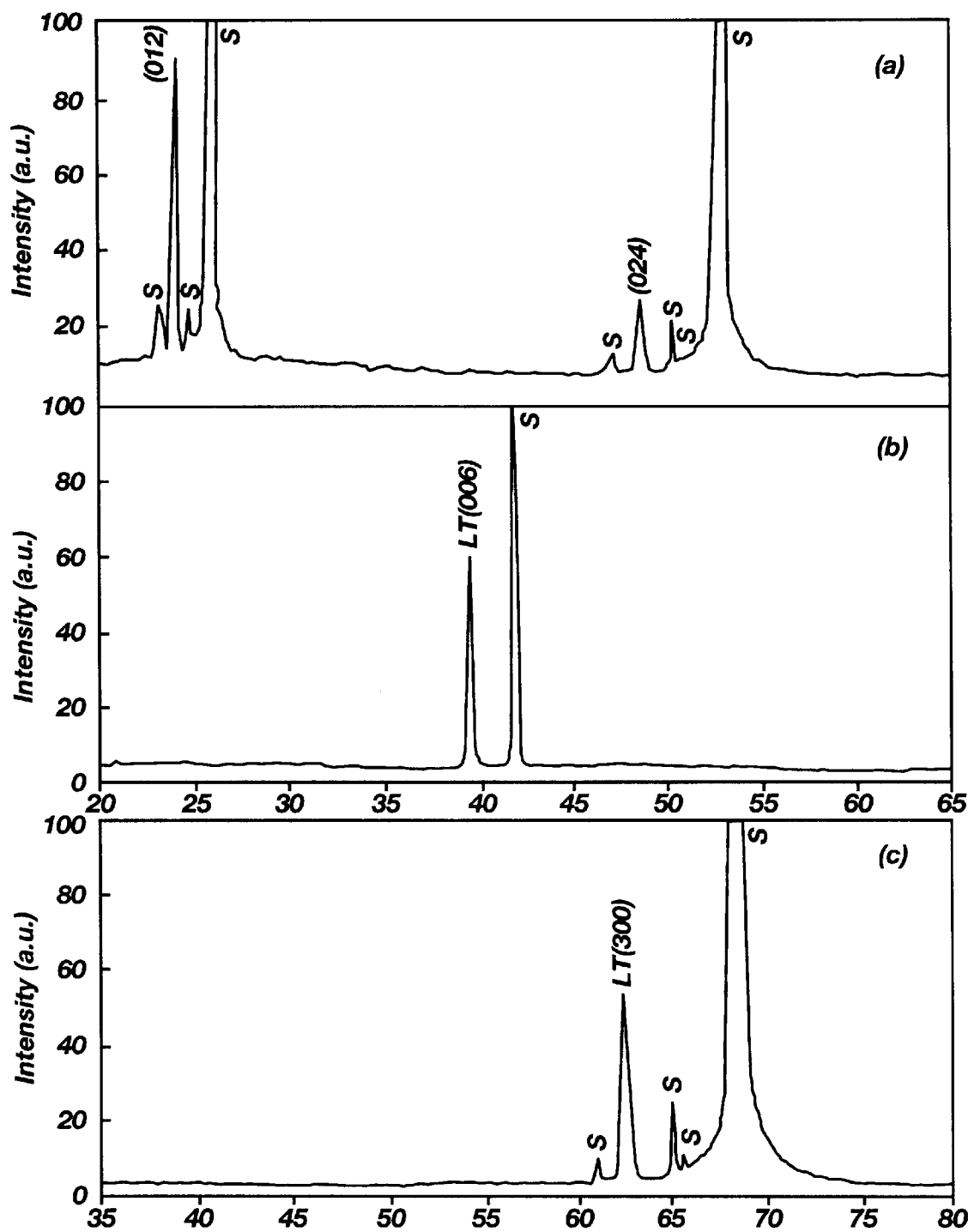
FIG. 4 illustrates of the characteristic X-ray diffraction patterns of $LiTaO_3$ films produced in accordance with this invention on substrates of sapphire having different orientations.
Figure 5:
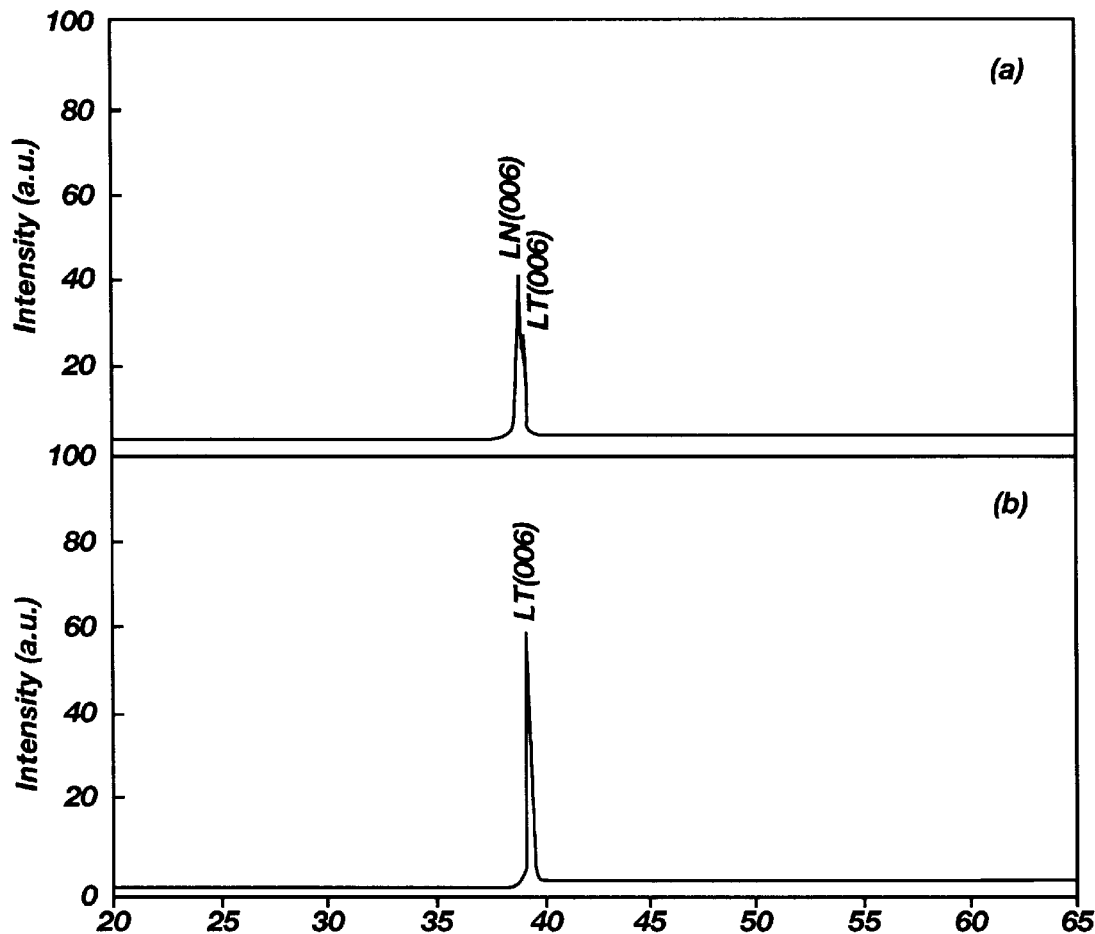
FIG. 5 illustrates the characteristic X-ray diffraction patterns of $LiTaO_3$ films produced in accordance with this invention on substrates of $LiNbO_3(0006)$ and $LiTaO_3$ (0006)

FIGS. 4 and 5 report X-ray diffraction patterns for crystalline films 75 grown on sapphire (01$\bar{1}$2), (10$\bar{1}$0), and (0006); and on LiNbO$_3$ (0006) and LiTaO$_3$ (0006). Films 75 appear to be epitaxial. Indexed peaks correspond to LiTaO$_3$.

Scanning electron microscope (SEM) images of a LiTaO$_3$ film 75 grown on sapphire (10$\bar{1}$0) showed the film to be of high quality. A rocling curve (θ-scan) taken from the film 75 showed a full-width at half maximum (FW) of 0.25 degree (900 arcsecond), indicating good epitaxial growth on sapphire (10$\bar{1}$0).

Figure 6:
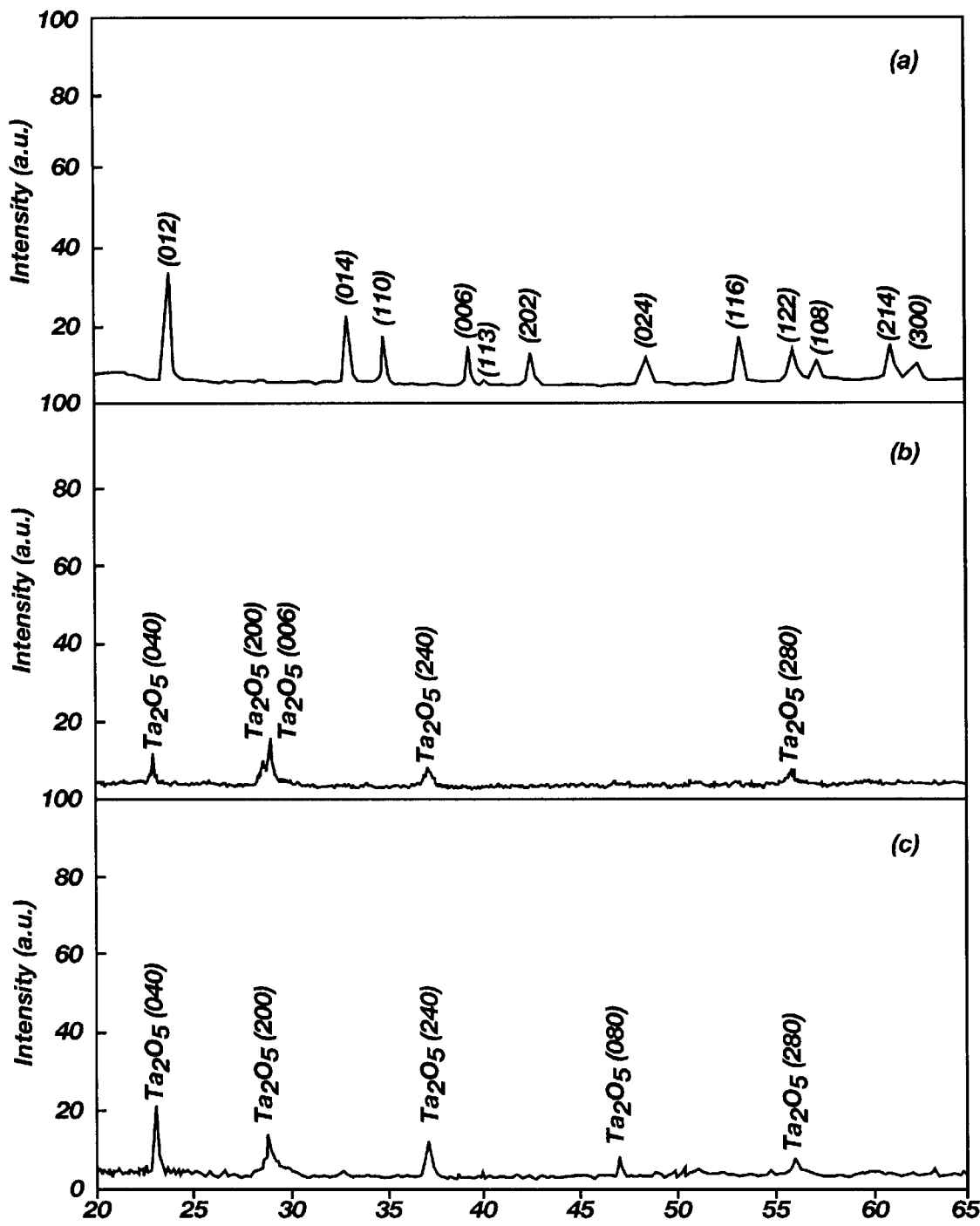
FIG. 6 illustrates the characteristic X-ray diffraction patterns of $LiTa(OBu^n)_6$, $LiTa(OBu^i)_6$, and $LiTa(OBu^t)_6$ films produced in accordance with this invention on substrates of fused silica.

A precursor 43 of LiTa(OBut$^n$)$_6$ resulted in stoichiometric LiTaO$_3$ films. LiTa(OBut$^i$)$_6$ and LiTa(OBu$^t$)$_6$ resulted in single phase β-Ta$_2$O$_5$ when the precursor was heated to about 195° C. The X-ray diffraction patterns of FIG. 6 suggest that iso- and tert-butoxides tended to decompose to single metal butoxides upon heating to temperatures over 200° C. Because Ta(OBut)$_5$ is more volatile than LiOBut, only Ta(OBut)$_5$ was transported to the reaction region 46 and substrate 50. Thus, LiTa(OBut$^n$)$_6$ is the preferred precursor under the selected conditions.

Example II

Film deposition was performed at an overall pressure of between 4.4 and 6 milli-bar in the chamber 14. The precursor 43 was heated to 195±5° C. The substrates 50, sapphire wafers, were heated with a programmable IR line heat source 54 via a graphite susceptor 52 to temperatures between 450° C. to 750° C. Deposited films 75 were generally of optical quality, fully dense, and amorphous. Samples were removed from the deposition chamber 14 and annealed at temperatures 50°–100° C. higher than the deposition temperature to achieve full crystallization.

Figure 7:
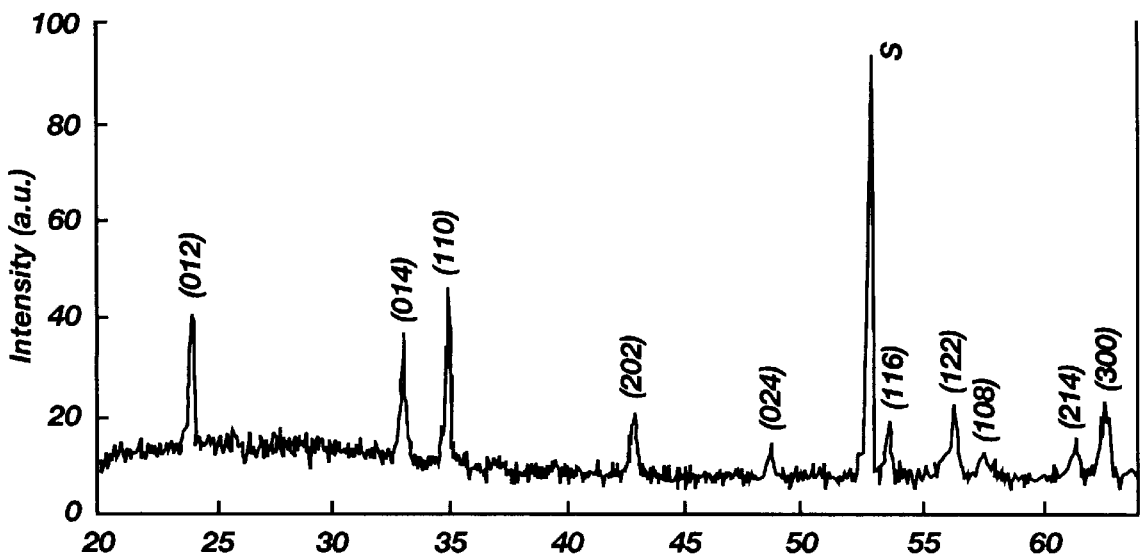
FIG. 7 illustrates a characteristic X-ray diffraction pattern of a thick, polycrystalline film of $LiTaO_3$ on a substrate of sapphire.

A film grown on sapphire for 1.5 hours was annealed at 750° C. for 5 hours. The film had a measured thickness of 34 μm. The growth rate corresponded to 23 μm per hour. Deposition rates as low as 1.8 μm/hour were observed. Even lower rates can be achieved by adjusting the flow rates of precursor 44 and water vapor 19. The X-ray diffraction patterns (FIG. 7) of the film showed all indexed peaks to be from the ilmenite structure of LiTaO$_3$. The peak designated "S" is that of sapphire (024). The X-ray pattern indicated (within the sensitivity of the method) that the film was pure $LiTaO_3$.

The films 75 were equally dense before and after annealing, as shown by SEM images of the film in cross-section. Refractive indices of films 75 measured before and after annealing confirmed these observations.

Example III

Figure 8:
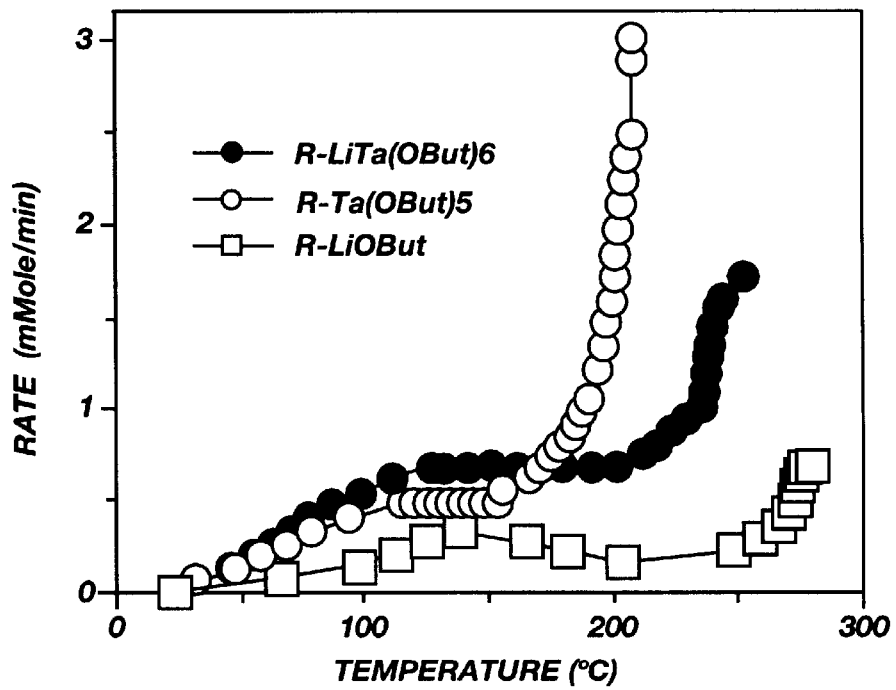
FIG. 8 is a plot of the nominal evaporation rates obtained in Example III, recorded in millimoles per minute as a function of Celsius temperature for individual and double alkoxides.

Nominal evaporation rates of individual alkoxides, $LiOBut^n$ and $Ta(OBut^n)_5$, and the double alkoxide $LiTa(OBut^n)_6$, as functions of temperature, were characterized without carrier gas and water vapor over a range from room temperature up to that used for typical depositions. The mechanical pump used to evacuate the deposition apparatus 12 had a constant air displacement rate of 160 liters per minute. At typical deposition pressures of a few mbar, gas behavior is virtually ideal. Thus the flow of each gaseous species (in moles-per-unit time) into the deposition chamber 14 is considered to contribute linearly to the overall measurable chamber pressure. Therefore, measurement of the overall chamber pressure yields a nominal evaporation rate of the precursor 43 at the temperature of the evaporator 40. FIG. 8 reports the nominal evaporation rates of $LiOBut^n$, $Ta(OBut^n)_5$, and $LiTa(OBut^n)_6$ as functions of temperature of.

$Ta(OBut^n)_5$ is more volatile than $LiOBut^n$ throughout the temperature range. Thus, a mechanical mixture having a 1:1 molar ratio of $LiOBut^n$ to $Ta(OBut^n)_5$ will not give an equal-molar evaporation of these compounds into the vapor phase and will not result in stoichiometric deposition. $LiTa(OBut^n)_6$ shows a relatively constant evaporation rate through a wide evaporator temperature range, from 125° C. to 210° C. indicating that $LiTa(OBut^n)_6$ is thermally stable at temperatures below 210° C. It has a uniform evaporation rate when the evaporator is held within this temperature range. It is recognized that the evaporator temperature is not the actual temperature of the precursor, but rather the temperature of the heating mantle. As a practical matter, however, this example demonstrates the advantage of the double metal alkoxy precursors.

Example IV

Figure 9:
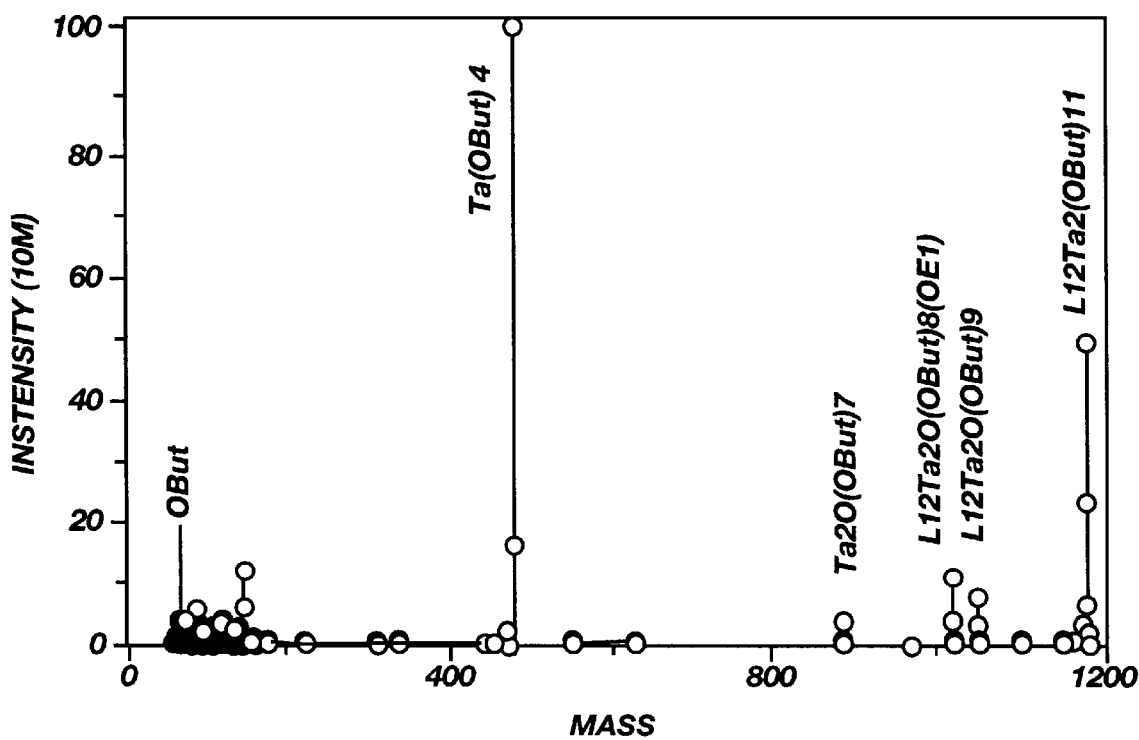
FIG. 9 is a plot of the mass spectrum, showing fragmentation patterns, obtained in Example IV for $Li_2Ta_2(OBu^n)_{12}$.

A mass spectrometry study was conducted on $LiTa(OBut^n)_6$ heated from room temperature to 355° C. at a constant heating rate. FIG. 9 illustrates the mass spectrum at 146° C. The mass spectra obtained are considered strong evidence that the precursor vapor consists of the dimmeric form of $LiTa(OBut^n)_6$; i.e., the volatile $Li_2Ta_2(OBut^n)_{12}$.

We claim:

1. A method for the chemical vapor deposition of a film on a substrate, comprising:

placing a substrate within a chamber of an apparatus comprising:
   a chamber for containing said substrate;
   an evaporator constructed and arranged to vaporize a precursor and to introduce such vaporized precursor into said chamber;
   a generator positioned to introduce a hydrolyzing agent into said chamber;
   a reaction zone within said chamber positioned to receive said precursor and said hydrolyzing agent, whereby to hydrolyze said precursor; and
   structure positioned within in said chamber in the proximity of said reaction zone, said structure being constructed and arranged to promote a polycondensation reaction of said hydrolyzed precursor on the substrate;

introducing a volatile multimetalorganic precursor to said evaporator and operating said evaporator to effect delivery of vaporized said precursor to said reaction zone;

operating said generator to effect the delivery of a hydrolyzing agent to said reaction zone; and establishing conditions of temperature and pressure in the vicinity of said substrate to promote said polycondensation reaction, whereby to effect the deposition of said film containing each of the metal constituents of said multimetalorganic precursor in the stoichiometric ratio that those constituents are present in said precursor, wherein said substrate is mounted on a holder constituting means for altering substrate temperature and said holder is operated to control temperature of said substrate to whithin the range of about 400° to about 800° C.

* * * * *